United States Patent
Chang et al.

(10) Patent No.: US 7,375,005 B2
(45) Date of Patent: May 20, 2008

(54) METHOD FOR RECLAIMING AND REUSING WAFERS

(75) Inventors: Jen-Chieh Chang, Hsinchu (TW); Shih-Chi Lai, Hsinchu (TW); Yi-Fu Chung, Hsinchu (TW); Chih-Shin Tsai, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 94 days.

(21) Appl. No.: 10/942,690

(22) Filed: Sep. 15, 2004

(65) Prior Publication Data

US 2005/0250277 A1    Nov. 10, 2005

(30) Foreign Application Priority Data

May 10, 2004    (TW) ................................ 93113072 A

(51) Int. Cl.
*H01L 21/46*    (2006.01)
(52) U.S. Cl. ...................... 438/455; 438/488; 438/684; 438/479; 257/686; 257/753; 257/E21.122; 257/E21.567; 257/E21.568
(58) Field of Classification Search ................ 438/448, 438/455, 454, 479, 458, 684; 257/686, 753, 257/E21.122, E21.567, E21.568
See application file for complete search history.

(56) References Cited

U.S. PATENT DOCUMENTS

| 6,534,380 | B1 * | 3/2003 | Yamauchi et al. | 438/455 |
| 6,794,227 | B2 * | 9/2004 | Koveshnikov | 438/149 |
| 2003/0087108 | A1 * | 5/2003 | Herner et al. | 428/446 |
| 2003/0159644 | A1 * | 8/2003 | Yonehara et al. | 117/8 |
| 2004/0185638 | A1 * | 9/2004 | Kakizaki et al. | 438/406 |

OTHER PUBLICATIONS

Handbook of semiconductor wafer cleaning technology-science, technology, and application edited by:Kern, W.*

* cited by examiner

*Primary Examiner*—Hsien Ming Lee
*Assistant Examiner*—Su C Kim
(74) *Attorney, Agent, or Firm*—Townsend and Townsend and Crew, LLP

(57) ABSTRACT

Embodiments of the present invention provide a method for reclaiming and reusing a wafer. In one embodiment, a method for reclaiming a wafer comprises providing a used, nonproductive wafer having a semiconductor substrate and a polysilicon layer formed on the semiconductor substrate; oxidizing a first part of the polysilicon layer to form a first oxide layer; removing the first oxide layer; and oxidizing a second part of the polysilicon layer to form a second oxide layer on the used wafer which is to be used as a reclaimed wafer. The nonproductive wafer is used to improve the quality of a deposition process of the polysilicon layer on one or more productive wafers.

23 Claims, 3 Drawing Sheets

METHOD FOR RECLAIMING AND REUSING WAFERS

CROSS-REFERENCES TO RELATED APPLICATIONS

This application claims priority from R.O.C. Patent Application No. 093113072, filed May 10, 2004, the entire disclosure of which is incorporated herein by reference.

BACKGROUND OF THE INVENTION

The present invention relates to a method for reclaiming and reusing a wafer, and more particularly to a method for reclaiming and reusing a dummy wafer.

In the semiconductor industry, the wafer for controlling the stability of batch-to-batch fabrication is called a control wafer, and the wafer for maintaining the stability of single-batch fabrication is called a dummy wafer. For example, in order to control the stability of a machine, the wafer for non-productive purposes (e.g., usually bare silicon wafer) and the wafer for productive purposes are often put into the machine together during the polysilicon deposition process. By measuring the thickness of the polysilicon deposited on the wafer for non-productive purposes, the stability of fabrication (e.g., deposition rate, film property, and so on) can be controlled, and such kind of wafer for non-productive purposes is the so-called control wafer. Moreover, in order to maintain the quality of single-batch fabrication (e.g., the thickness uniformity of film), the wafer for non-productive purposes and the wafer for productive purposes are put into the boat together. Through filling these wafers for non-productive purposes in the boat, the product can be deposited stably and uniformly on the wafer to maintain the stability of single-batch fabrication when the reactive gas reacts in the furnace, and such kind of wafer for non-productive purposes is the so-called dummy wafer. Sometimes the used control wafer can be used as the dummy wafer.

The dummy wafer should be discarded or reclaimed after it has been reused many times; otherwise, the film will be peeled off from the dummy wafer due to the high stress of the film on the dummy wafer, which can cause severe pollution in the single-batch fabrication. The "reclaiming process" is to remove the film to acquire the bare silicon wafer. The reclaimed wafer can then be used as a control wafer or a dummy wafer.

For the over-reused dummy wafer, the reclaiming process is to directly remove the whole film by the grinding method, but this method will polish the wafer to the underside of the silicon substrate, so that the wafer will become thin and easy to break; besides, the outer annular portion of the film of the wafer may not be polished in some cases. Moreover, a wet etching method can also be used to directly remove the whole film. However, for the dummy wafer that is deposited with polysilicon, for example, since the etchant is used to remove the polysilicon layer, it will continue to etch the silicon wafer and cause the wafer to become thin and easy to break. Furthermore, if the availability of the etching or polishing machines is limited, the dummy wafers cannot be reclaimed as control wafers immediately, so the manufacturers need to additionally buy new wafers in response thereto.

Therefore, there is a need to develop a new method for reclaiming and reusing a wafer to overcome the aforesaid problems and difficulties in the prior art.

BRIEF SUMMARY OF THE INVENTION

Embodiments of the present invention provide a method for reclaiming and reusing a wafer. The present invention can be illustrated in at least three directions, including the method for reclaiming the used wafer, the method for manufacturing the dummy wafer, and the method for reusing the wafer to improve the quality of the fabrication process.

The features and improvements of the present invention include: 1) preventing the thinness and breakability of wafer due to the reclaiming process, 2) solving the problem of failing to remove the outer annular portion of the film of the wafer, 3) prolonging the use-span of the wafer, and 4) reduce the use limit of machines.

In accordance with an aspect of the present invention, a method for reclaiming a wafer comprises providing a used, nonproductive wafer having a semiconductor substrate and a polysilicon layer formed on the semiconductor substrate; oxidizing a first part of the polysilicon layer to form a first oxide layer; removing the first oxide layer; and oxidizing a second part of the polysilicon layer to form a second oxide layer on the used wafer which is to be used as a reclaimed wafer. The nonproductive wafer is used to improve the quality of a deposition process of the polysilicon layer on one or more productive wafers.

In some embodiments, the nonproductive wafer is a dummy wafer. The polysilicon layer is a doped polysilicon, an undoped polysilicon, or an amorphous polysilicon layers. Removing the first oxide layer is performed by etching. The etching is wet etching. The wet etching is performed with a solution containing HF. The wet etching may be performed with a buffered oxide etchant (BOE). Oxidizing the first part of the polysilicon layer is performed by thermal oxidation. Oxidizing the second part of the polysilicon layer is performed by thermal oxidation.

In accordance with another aspect of the invention, a method for manufacturing a reusable wafer comprises providing a nonproductive wafer having a semiconductor substrate and a polysilicon layer formed on the semiconductor substrate; oxidizing a first part of the polysilicon layer to form a first oxide layer; removing the first oxide layer; and oxidizing a second part of the polysilicon layer to form a second oxide layer. The nonproductive wafer is reusable to improve the quality of a deposition process of the polysilicon layer on one or more productive wafers.

Another aspect of the present invention is directed to a method for advancing the quality of a polysilicon deposition process to reuse a reclaimed wafer. The method comprises providing a reclaimed wafer in an apparatus of a first polysilicon deposition process, and performing the first polysilicon deposition process to deposit a polysilicon layer on one or more productive wafers. The reclaimed wafer is produced by providing a used, nonproductive wafer having a semiconductor substrate and a second polysilicon layer formed on the semiconductor substrate; oxidizing a first part of the second polysilicon layer to form a first oxide layer; removing the first oxide layer; and oxidizing a second part of the second polysilicon layer to form a second oxide layer on the used wafer which is to be used as the reclaimed wafer.

The present invention will be illustrated in the following drawings and embodiments, but the processes, steps, materials, sizes, structures or other optional parts described in the embodiments do not limit the present invention.

DETAILED DESCRIPTION OF THE INVENTION

Some typical embodiments to present the features and advantages of the present invention will be particularly described in the following illustrations. It should be understood that the present invention may have various modifications in different modes, which are not apart from the scope of the present invention, and the illustrations and drawings of the present invention are substantially used for explaining but not for limiting the present invention.

The wafer provided by the present invention is applied to improve the quality of the fabrication process; the following will take the deposition process as an example to illustrate the present invention. The wafer of the present invention can be called a dummy wafer or a control wafer and can be put together with the wafer for productive purpose into a furnace to perform a deposition process (e.g., polysilicon deposition process). Through filling the dummy wafer in the boat, the product can be deposited stably and uniformly on the wafer to maintain the stability of single-batch fabrication when the reactive gas reacts in the furnace.

One embodiment of the present invention involves the polysilicon deposition process. In the embodiment, the thickness of the polysilicon layer will achieve several μm after the dummy wafer is used many times; for example, the deposited thickness of the polysilicon layer will on average increase 0.2 μm after each use, and if the wafer is used for 40 times, the thickness will achieve 8 μm. In order to prevent the peeling of the polysilicon layer due to the stress, the dummy wafer is usually performed with a reclaiming and reusing process after being used a predetermined number of times.

Figure 1A:
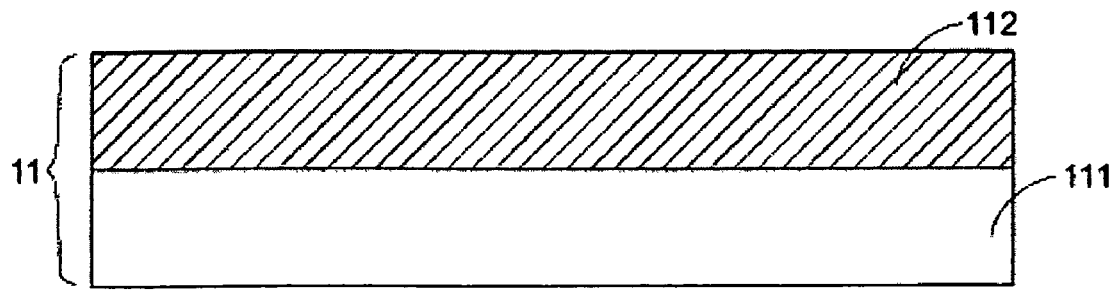
FIGS. 1(a)-(f) are cross-sectional views illustrating the method for reclaiming a wafer according to an embodiment of the present invention.

FIGS. 1(a)-(f) are cross-sectional views of a wafer being processed to illustrate the method for reclaiming the wafer according to a preferred embodiment of the present invention. As shown in FIG. 1(a), taking a polysilicon deposition process as an example, first, a dummy, or non-productive, wafer 11 that is used to improve the quality of the polysilicon deposition process is provided. The dummy wafer 11 comprises a substrate 111 (e.g., semiconductor substrate) and a deposition layer 112, wherein the deposition layer 112 is a polysilicon layer formed by one or more deposition processes on the substrate 111 in a deposition apparatus (e.g., furnace).

The deposition layer 112 can also be formed on the lower or side surfaces of the wafer, but it is only shown on one surface of the wafer in the drawings of the embodiments. In fact, the following described process also has similar effects on another surface or side surface of the wafer.

Figure 1B:
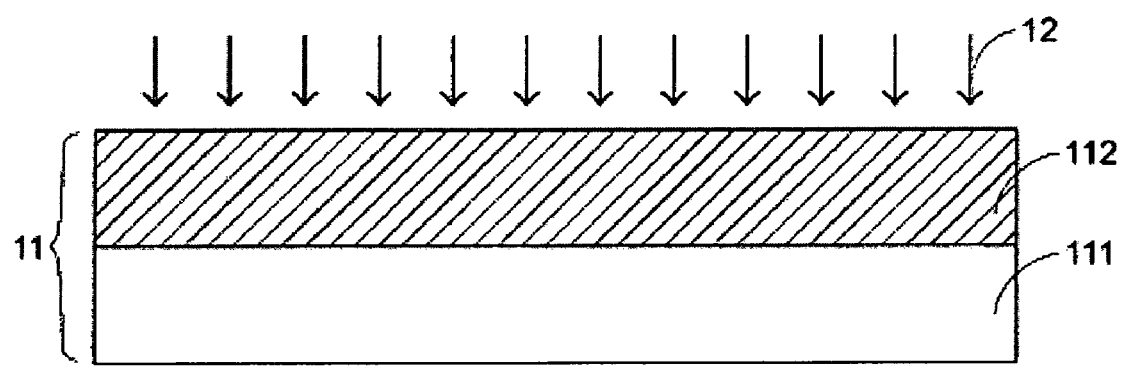
Figure 1C:
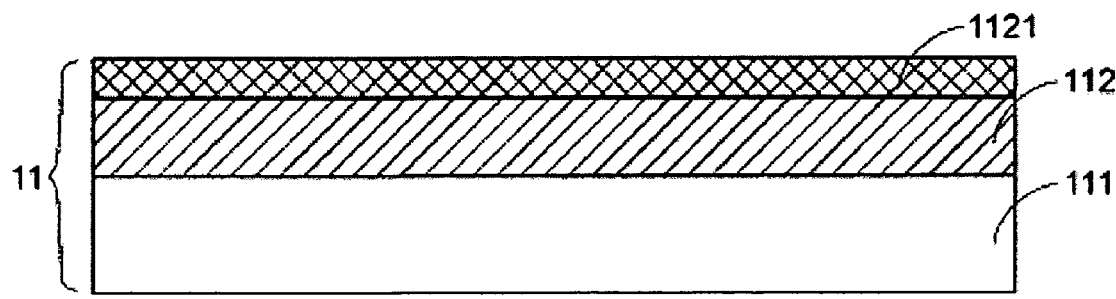

Next, as shown in FIG. 1(b), a thermal oxidation process 12 is performed on the substrate 111 to oxidize a part of the deposition layer 112 into an oxide layer 1121 shown in FIG. 1(c). In some embodiments, because the operative temperature of the thermal. oxidation process 12 is between about 800 and 1100° C., the lattice structure of the deposition layer 112 will rearrange to reduce the stress of the deposition layer 112 during the thermal oxidation process. In specific embodiments, the oxide layer 1121 is a silicon oxide layer (e.g., silicon dioxide layer) formed by the thermal oxidation process; its thickness is between about 500 and 1500 Å. In specific embodiments, the conditions for the thermal oxidation process, for example, are that: the machine, TEL IW-6D, made by a Japanese company, TOKYO ELECTRON LIMITED is used to perform the thermal oxidation process, the operative temperature is 950° C., the flow rates of $H_2$ and $O_2$ are respectively 5500 sccm and 3300 sccm, the pressure is 760 torr, and the reaction time is 20 minutes, so that the oxide layer with a thickness of about 1000 Å can be formed.

Figure 1D:
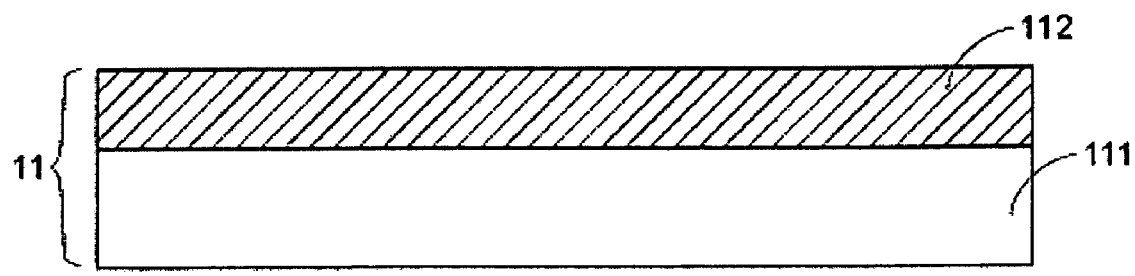

Later, as shown in FIG. 1(d), the oxide layer 1121 is removed from the surface of the deposition layer 112; for example, a wet etching method is used to smooth the surface of the deposition layer 112 and remove the impurities on the surface of the deposition layer 112. In some embodiments, the wet etching method can be performed with the solution containing HF or buffered oxide etchant (BOE). In specific embodiments, the conditions for the wet etching method, for example, are that: the etching machine, DNSWS 620C, made by a Japanese company, Dai Nippon Screen, is used to perform the process of removing the oxide layer 1121, the operative temperature is 25° C., the solution containing 5% by weight of HF is used, and the etching rate is that an oxide layer with a thickness of about 2000 Å can be removed in 400 seconds.

Figure 1E:
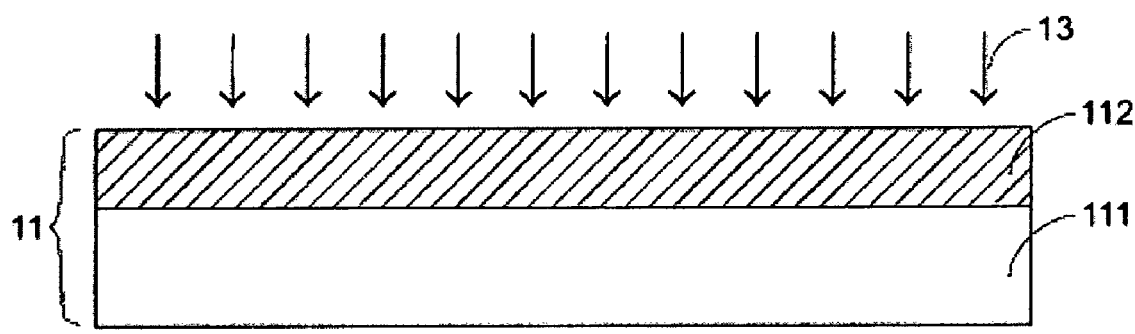
Figure 1F:
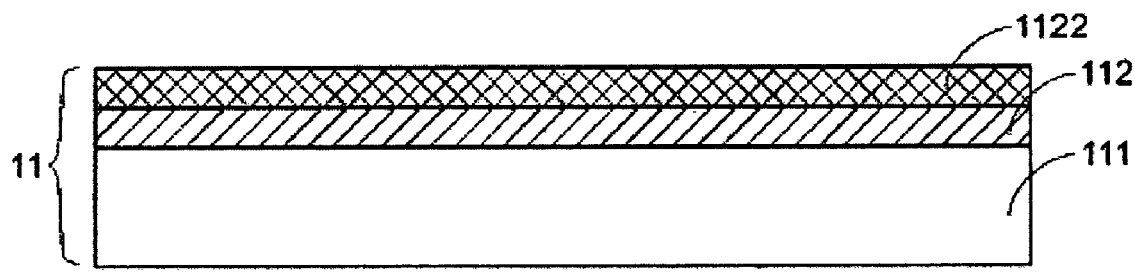

Subsequently, as shown in FIG. 1(e), a thermal oxidation process 13 is performed on the substrate 111 and the deposition layer 112 to oxidize a part of the deposition layer 112 into an oxide layer 1122 shown in FIG. 1(f). In some embodiments, because the operative temperature of the thermal oxidation process 13 is between about 800 and 1100° C., the lattice structure of the deposition layer 112 will rearrange to reduce the stress of the deposition layer 112 during the thermal oxidation process. In addition, the oxide layer 1122 can be used to reduce the stress of the later deposited polysilicon layer. In some embodiments, the oxide layer 1122 is a silicon oxide layer (e.g., silicon dioxide layer) formed by the thermal oxidation process; its thickness is between about 3000 and 6000 Å. In specific embodiments, the conditions for the thermal oxidation process, for example, are that: the machine, TEL IW-6D, made by a Japanese company, TOKYO ELECTRON LIMITED is used to perform the thermal oxidation process, the operative temperature is 1000° C., the flow rates of $H_2$ and $O_2$ are respectively 5500 sccm and 3300 sccm, the pressure is 760 torr, and the reaction time is 2.5 hours, so that the oxide layer 1122 with a thickness of about 5000 Å can be formed.

In some embodiments, the remaining deposition layer 112 can be completely oxidized into the oxide layer 1122.

In some other embodiments, the above-described oxidation-removal-oxidation serial steps can be repeatedly executed until a desired thickness of the oxide layer is obtained. For example, the remaining deposition layer 112 does not need to be completely oxidized into the oxide layer 1122 after the oxide layer 1121 is removed, but only the upper portion of the deposition layer 112 is oxidized, then the oxide layer is removed, and finally the whole deposition layer 112 is oxidized.

In other embodiments, the deposition layer 112 is not completely removed.

After the original wafer is reclaimed through the above-described methods, a new, reclaimed wafer is produced and can be used as a dummy wafer or a control wafer. Taking the polysilicon deposition process as an example, it can cause the lattice structure of the polysilicon deposition layer of the original dummy wafer to rearrange and reduce the stress, and for the new produced control wafer or dummy wafer, it can also release the stress of the later deposited polysilicon layer to the oxide layer 1122.

According to the present embodiment, the use life of the dummy wafer 11 can be increased. Moreover, the peeling of the deposited polysilicon layer due to the stress will not occur when the dummy wafer is reused.

Figure 2A:
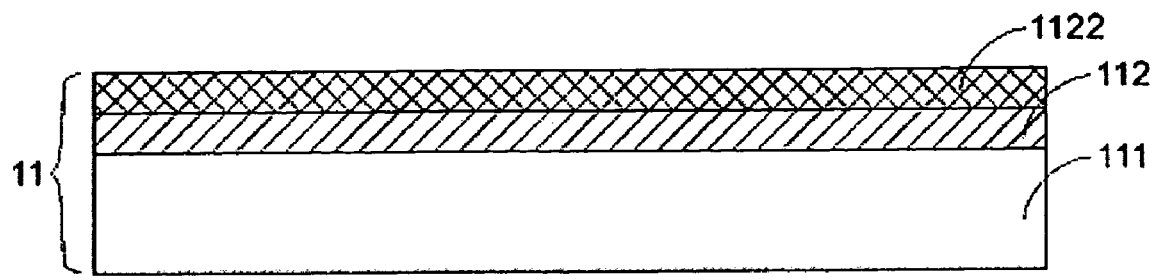
FIGS. 2(a)-(c) are cross-sectional views illustrating the method for reusing a wafer according to an embodiment of the present invention.
Figure 2B:
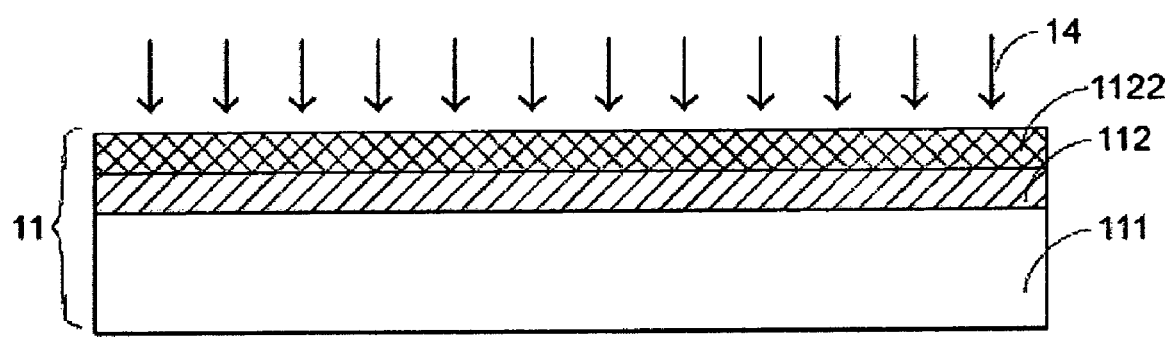
Figure 2C:
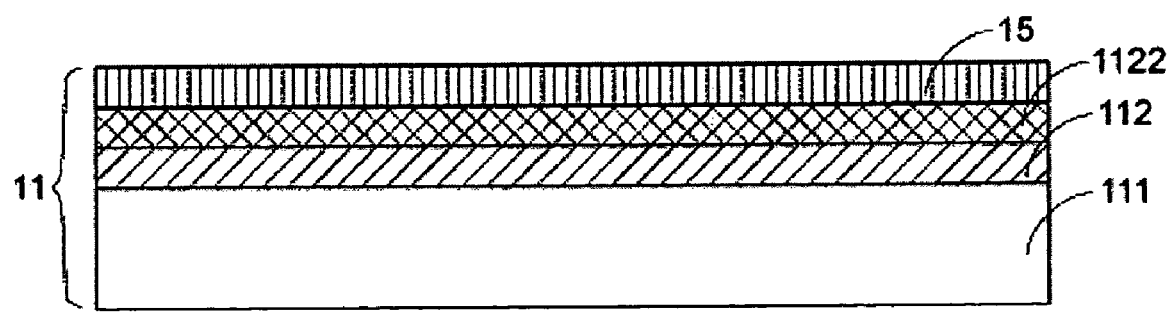

FIGS. 2(*a*)-(*c*) are cross-sectional views of a wafer being processed to illustrate the method for reusing the wafer according to one preferred embodiment of the present invention. As shown in FIG. 2(*a*), taking the polysilicon deposition process as an example, first, a dummy wafer 11 (or 11 can also represent a control wafer) reclaimed through the aforesaid method is provided. The dummy wafer comprises a substrate 111 (e.g., semiconductor substrate), a deposition layer 112, and an oxide layer 1122 (see also FIG. 1(*f*)). FIG. 2(*a*) can represent a structure diagram of a dummy wafer or a control wafer provided according to embodiments of the present invention.

Then, the dummy wafer 11 is put into a deposition apparatus (e.g., furnace) to perform a deposition process 14 (e.g., polysilicon deposition process). The dummy wafer 11 is used to ensure that the product can be deposited stably and uniformly on the wafer to maintain the stability of single-batch fabrication when the reactive gas reacts in the furnace. Through the buffer effect of the oxide layer 1122, a deposition layer 15 can be deposited on the surface of the oxide layer 1122 of the dummy wafer 11.

The polysilicon deposition layer of the present invention can be a doped polysilicon layer, an undoped polysilicon layer, or an amorphous polysilicon layer. In some embodiments, the chemical vapor deposition for the doped polysilicon can be performed on the machine, TEL IW-6C, made by the Japanese company, TOKYO ELECTRON LIMITED. In one of the embodiments, the conditions for the chemical vapor deposition, for example, are that: the flow rate of SiH4 gas is 1000 sccm, the flow rate of PH3 gas is 125 sccm, the operative temperature is 575° C., and the pressure is 0.5 torr, so that an n-doped polysilicon layer with a thickness of about 500-8000 Å can be formed.

In another embodiment, the polysilicon deposition layer of the present invention is a composite layer of the undoped polysilicon and n-doped polysilicon. The conditions for forming the undoped polysilicon layer, for example, are that: the flow rate of SiH4 gas is 190 sccm, the operative temperature is 620° C., and the pressure is 0.25 torr, so that an undoped polysilicon layer with a thickness of about 500-8000 Å can be formed. A chemical vapor deposition may be performed to form an n-doped polysilicon layer, and the conditions for example are that: the flow rate of $O_2$ gas is 500 sccm, the operative temperature is 800° C., and phososhoryl chloride ($POCl_3$) is doped to form the n-doped polysilicon layer.

In specific embodiments, the chemical vapor deposition for the undoped polysilicon can be performed on the machine, TEL IW-6C, made by the Japanese company, TOKYO ELECTRON LIMITED, and the conditions for example are that: the flow rate of SiH4 gas is 190 sccm, the operative temperature is 620° C., and the pressure is 0.25 torr, so that an undoped polysilicon layer with a thickness of about 500-8000 Å can be formed; or, in another embodiment, the conditions, for example, are that: the flow rate of $SiH_4$ gas is 155 sccm, the operative temperature is 575° C., and the pressure is 0.2 torr, so that a rugged polysilicon layer with a thickness of about 500-8000 Å can be formed.

In specific embodiments, the chemical vapor deposition for the amorphous polysilicon can be performed on the machine, TEL IW-6C, made by the Japanese company, TOKYO ELECTRON LIMITED, and in one of the embodiments, the conditions, for example, are that: the flow rate of $SiH_4$ gas is 190 sccm, the operative temperature is 550° C., and the pressure is 0.25 torr, so that an amorphous polysilicon layer with a thickness of about 500-8000 Å can be formed.

In conclusion, embodiments of the present invention provide a method for reclaiming and reusing the wafer; thereby, the dummy wafer can be reclaimed and reused so as to increase the use life of the dummy wafer, lower the reclaiming cost, and reduce the amount of discarded dummy wafers.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method for reclaiming a wafer, comprising:
providing a used, nonproductive wafer having a semiconductor substrate and a polysilicon layer formed on said semiconductor substrate;
oxidizing a first part of said polysilicon layer to form a first oxide layer;
removing said first oxide layer to expose a second part of said polysilicon layer; and
oxidizing said second part of said polysilicon layer to form a second oxide layer on the used wafer which is to be used as a reclaimed wafer;
wherein said nonproductive wafer is used to improve the quality of a deposition process of said polysilicon layer on one or more productive wafers,
wherein the second oxide layer is formed prior to using the used wafer as a reclaimed wafer.

2. The method of claim 1 wherein said nonproductive wafer is a dummy wafer.

3. The method of claim 1 wherein said polysilicon layer is a doped polysilicon, an undoped polysilicon, or an amorphous polysilicon layer.

4. The method of claim 1 wherein removing said first oxide layer is performed by etching.

5. The method of claim 4 wherein said etching is wet etching.

6. The method of claim 5 wherein said wet etching is performed with a solution containing HF.

7. The method of claim 5 wherein said wet etching is performed with a buffered oxide etchant (BOE).

8. The method of claim 1 wherein oxidizing said first part of said polysilicon layer is performed by thermal oxidation.

9. The method of claim 1 wherein oxidizing said second part of said polysilicon layer is performed by thermal oxidation.

10. The method of claim 1 wherein said first part of said polysilicon layer is an exposed part, and wherein said first oxide layer is an exposed first oxide layer.

11. The method of claim 1 wherein oxidizing said second part of said polysilicon layer comprises oxidizing an entire polysilicon layer to form said second oxide layer.

12. The method of claim 11 further comprising removing said second oxide layer.

13. A method for manufacturing a reusable wafer, comprising:

providing a nonproductive wafer having a semiconductor substrate and a polysilicon layer formed on said semiconductor substrate;

oxidizing a first part of said polysilicon layer to form a first oxide layer;

removing said first oxide layer to expose a second part of said polysilicon layer; and oxidizing said second part of said polysilicon layer to form a second oxide layer;

wherein said nonproductive wafer is reusable to improve the quality of a deposition process of said polysilicon layer on one or more productive wafers, wherein the second oxide layer is formed prior to using the used wafer as a reclaimed wafer.

14. A method for advancing the quality of a polysilicon deposition process to reuse a reclaimed wafer, comprising:

providing a reclaimed wafer in an apparatus of a first polysilicon deposition process, and performing said first polysilicon deposition process to deposit a first polysilicon layer on one or more productive wafers;

wherein said reclaimed wafer is produced by providing a used, nonproductive wafer having a semiconductor substrate and a second polysilicon layer formed on said semiconductor substrate;

oxidizing a first part of said second polysilicon layer to form a first oxide layer;

removing said first oxide layer to expose a second part of said polysilicon layer; and oxidizing said second part of said second polysilicon layer to form a second oxide layer on the used wafer which is to be used as the reclaimed wafer, wherein the second oxide layer is formed prior to using the used wafer as a reclaimed wafer.

15. The method of claim 14 wherein said nonproductive wafer is a dummy wafer.

16. The method of claim 14 wherein said second polysilicon layer is a doped polysilicon, an undoped polysilicon, or an amorphous polysilicon layer.

17. The method of claim 14 wherein removing said first oxide layer is performed by etching.

18. The method of claim 17 wherein said etching is wet etching.

19. The method of claim 18 wherein said wet etching is performed with a solution containing HF.

20. The method of claim 18 wherein said wet etching is performed with a buffered oxide etchant (BOE).

21. The method of claim 14 wherein oxidizing said first part of said second polysilicon layer is performed by thermal oxidation.

22. The method of claim 14 wherein oxidizing said second part of said second polysilicon layer is performed by thermal oxidation.

23. The method of claim 14 wherein reclaimed wafer said first polysilicon layer is a doped polysilicon, an undoped polysilicon, or an amorphous polysilicon layers.

* * * * *